United States Patent

Fauth et al.

[15] 3,702,953

[45] Nov. 14, 1972

[54] PRINTED CIRCUIT ARRANGEMENT

[72] Inventors: Günter Fauth, Unterhaching; Rainer Spinnler, Munich, both of Germany

[73] Assignee: Agfa-Gevaert Aktiengesellschaft, Leverkusen, Germany

[22] Filed: April 27, 1971

[21] Appl. No.: 137,767

[30] Foreign Application Priority Data

April 28, 1970 Germany .........G 70 16 022.4

[52] U.S. Cl.................317/101 CP, 29/626, 174/68.5

[51] Int. Cl................................................H05k 1/18

[58] Field of Search..174/68.5, 117 FF; 317/101 CP, 317/101 CE, 101 CC; 339/17 G, 17 F; 29/626

[56] References Cited

UNITED STATES PATENTS

| | | | |
|---|---|---|---|
| 2,749,382 | 6/1956 | Lockard | 174/117 FF X |
| 3,192,307 | 6/1965 | Lazar | 317/101 CP X |
| 3,447,038 | 5/1969 | Liben | 317/101 CE X |

FOREIGN PATENTS OR APPLICATIONS

| | | | |
|---|---|---|---|
| 1,099,888 | 3/1955 | France | 174/DIG. 3 |

*Primary Examiner*—Darrell L. Clay
*Attorney*—Michael S. Striker

[57] ABSTRACT

A printed circuit arrangement for use as a compact part of the exposure control in a photographic apparatus has an insulating plate provided with a recess for a portion of or an entire prefabricated electrical or electronic component with several coplanar terminals which contact discrete coplanar conductors applied (by printing or otherwise) to one surface of the plate. An insert of insulating material is interposed between overlapping portions of one or more conductors and one or more terminals to prevent the flow of current between those conductors and those terminals which must be insulated from each other when the plate is built into a photographic apparatus. The outline of the recess conforms to the outline of the component and the insert surrounds a portion of or the entire component and is bonded or clamped to the plate to remain in requisite position.

6 Claims, 2 Drawing Figures

PATENTED NOV 14 1972 3,702,953

INVENTOR
GÜNTER FAUTH
RAINER SPINNLER

BY
Attorney

PRINTED CIRCUIT ARRANGEMENT

BACKGROUND OF THE INVENTION

The present invention relates to printed circuits in general, and more particularly to arrangements which include one or more printed circuits and can be used with particular advantage in photographic apparatus, especially in the exposure controls of still cameras or motion picture cameras. Still more particularly, the invention relates to printed circuit arrangements which can be used in compact cameras or in cameras wherein or whereon space is at a premium for other reasons so that it is important to insure that the elements of the exposure control occupy as little room as possible.

SUMMARY OF THE INVENTION

An object of the invention is to provide a compact, lightweight, relatively simple and versatile printed circuit arrangement for use in photographic apparatus.

Another object of the invention is to provide a printed circuit arrangement or assembly which can be mass-produced at reasonable cost and can be used to establish electrical connections between a wide variety of electrical components, such as capacitors, resistances, inductances, switching circuits and/or many others.

A further object of the invention is to provide a printed circuit arrangement which is constructed and assembled in such a way that it can be installed, with substantial savings in space, in existing types of photographic apparatus, particularly as parts of exposure controls for use in photographic apparatus.

The improved printed circuit arrangement comprises a substantially plate-like insulating support which is provided with at least one recess extending inwardly from one of its surface toward and, if necessary, all the way to the other surface, a prefabricated component such as a casing containing certain elements of or a complete electric or electronic circuit and provided with several current-conducting terminals including a first and a second terminal adjacent to the one surface of the support when the component is properly positioned so that at least a portion thereof extends into the recess, a plurality of conductors applied to the one surface of the support and including first and second conductors which are respectively contacted by the first and second terminals of the properly mounted component, and at least one insulating insert. A portion of the first terminal overlaps a portion of the second conductor and the insert is interposed between such portions of the first terminal and second conductor to prevent the flow of current between such parts.

The novel features which are considered as characteristic of the invention are set forth in particular in the appended claims. The improved printed circuit arrangement itself, however, both as to its construction and its mode of operation, together with additional features and advantages thereof, will be best understood upon perusal of the following detailed description of certain specific embodiments with reference to the accompanying drawing.

DESCRIPTION OF THE PREFERRED EMBODIMENTS

Figure 1:
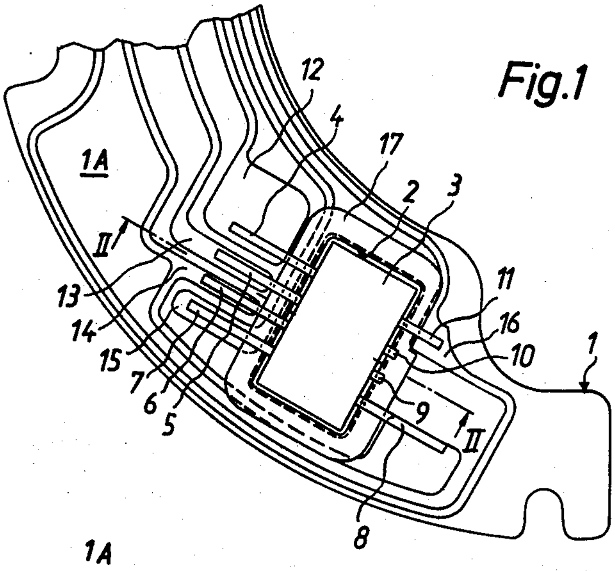
FIG. 1 is a fragmentary plan view of a printed circuit arrangement which embodies the invention.

The drawing illustrates a printed circuit arrangement which comprises a substantially plate-like support 1 consisting of insulating material, such as a suitable synthetic plastic substance, and one or more prefabricated electric components 3. Only one such component is shown in the drawing. The support 1 has a recess 2 for each of the components 3, and the illustrated recess is in the form of a hole or cutout which extends from the major surface 1A all the way to the other major surface 1B of the support 1. The illustrated recess 2 is of polygonal (rectangular) outline which conforms, at least slightly, to the outline of the component 3. The latter is assumed to be a prefabricated electronic switching circuit, for example, a circuit having two transistors, and at least a portion thereof extends into the recess 2 to thus reduce the height of that part which beyond the surface 1A. It is clear that the component 3 can be mounted in such a way that it extends only beyond the surface 1B, that it extends in part beyond the surface 1A and in part beyond the surface 1B, or that it is fully accommodated in the space between the planes of the two surfaces.

The component 3 has several outwardly extending preferably coplanar current-conducting terminals 4, 5, 6, 7, 8, 9, 10, 11 which can constitute pieces of metallic wire or metallic strip material. The terminals 4, 5, 6, 7, 8, 11 respectively overlap and contact conductors 12, 13, 14, 15, 16, which are applied to the surface 1A of the support 1 in a manner well known from the art of printed circuits and not forming part of the present invention. It will be noted that the conductor 14 is contacted by the terminals 6 and 8, and that the terminals 9, 10 are not shown in contact with any conductor or conductors.

The provision of the recess 2 for at least a portion of the component 3 constitutes one advantageous feature of the invention. Such mounting of the component 3 insures that a smaller portion thereof extends beyond the surfaces of the support, or, if the thickness of the component 3 is sufficiently small, that the entire component can be accommodated within the confines of the support. Furthermore since the outline of the recess 2 conforms to the general outline of the component 3, the latter is less likely to be inserted in improper position. The likelihood of improper insertion or orientation of the component is further reduced if the component has such an outline that it can be introduced into the recess in a single position (outlines resembling an isosceles triangle or a trapezium being but two of those outlines which insure proper insertion of the component in a single position).

Figure 2:
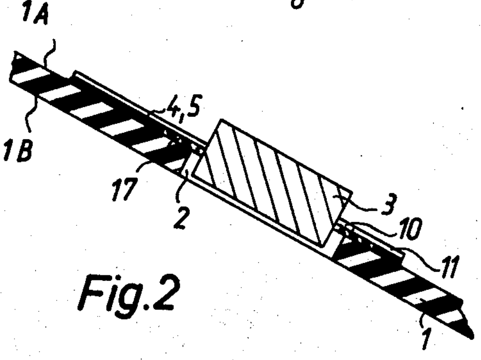
FIG. 2 is an enlarged fragmentary sectional view as seen in the direction of arrows from the line II—II of FIG. 1.

Another advantage of the improved arrangement is that a component with a large number of terminals can be properly mounted on an insulating support in such a way that all of the terminals can be located in or close to a common plane, i.e., in a plane which is parallel to the major surface 1A of the support 1 shown in FIGS. 1 and 2. This is made possible by applying at last one of the conductors in such position that a portion of such conductor is overlapped or crossed by at least one terminal which is intended to contact another conductor and by the use of one or more preferably deformable insulating inserts 17. As shown in FIG. 1, the terminal 7 contacts only the conductor 15 and the terminals 4, 5, 6 are respectively intended to contact only the conductors 12, 13, 14. However, the conductor 15 extends along one longer side of the recess 2 and is overlapped by portions of the terminals 4, 5, and 6. The insert 17 is placed between the conductor 15 and the terminals 4, 5, 6 to prevent the flow of current in undesired direction or directions when the arrangement is used in a photographic apparatus, for example, in the exposure control circuit of a still camera or motion picture camera. The illustrated distribution of conductors on the surface 1A of the support 1 renders it possible to place the terminals of the component rather close to each other without causing a short circuit when the terminals are finally soldered to the corresponding conductors in a well known manner, for example, by dipping, which forms no part of the invention. The terminals of the component need not be bent or otherwise deformed prior to soldering; this reduces the manufacturing cost.

In accordance with a more specific feature of the invention, the insert 17 is manufactured in the form of a frame which surrounds at least a portion of or the entire component 3 and can be held in requisite position by being clamped between the casing of the component and the adjacent portion of the support 1, preferably in a region close to or in immediate proximity of the recess 2. The illustrated insert 17 is of such size and shape that it completely surrounds the component 3 and that it is overlapped by each of the terminals 4 to 11. This insert can be glued or otherwise secured to the support 1 or is held merely by friction or by pressure of the component 3 when the latter is properly mounted in the recess 2.

It is clear that the support 1 can have any desired size or shape and that it can be provided with two or more recesses each of which can be of different shape to accommodate at least a portion of one of several additional components, not shown. Also, the number of terminals on each component can be different and the conductors for the terminals of each component need not be distributed in a manner as shown for the conductors 12 to 16. Furthermore, the insert 17 can consist of rigid or semirigid or elastic insulating material.

Without further analysis, the foregoing will so fully reveal the gist of the present invention that others can, by applying current knowledge, readily adapt it for various applications without omitting features which fairly constitute essential characteristics of the generic and specific aspects of our contribution to the art and, therefore, such adaptations should and are intended to be comprehended within the meaning and range of equivalence of the claims.

What is claimed as new and desired to be protected by Letters Patent is set forth in the appended

1. A printed circuit arrangement, particularly for use in photographic apparatus, comprising a substantially plate-like insulating support having opposed first and second surfaces and at least one recess extending from one of said surfaces toward the other surface: a prefabricated electric component having an outline at least approximating the outline of said recess, at least a portion of said component extending into said recess and said component having a plurality of current-conducting terminals adjacent to said one surface of said support, said terminals including a first and a second terminal; a plurality of conductors applied to said one surface, said conductors including a first and a second conductor respectively contacting said first and second terminals, a portion of said first terminal overlapping a portion of said second conductor; and a thin insulating frame secured to said support in the region of said recess and interposed between said portions of said first terminal and said second conductor, said frame at least partially surrounding said recess at said one surface of said support and being held by said component in a predetermined position relative to said support.

2. An arrangement as defined in claim 1, wherein said recess is an opening extending all the way to said other surface of said support.

3. An arrangement as defined in claim 1, wherein said terminals include a third terminal in contact with one of said first and second conductors so that said one conductor is contacted by several terminals of said component.

4. An arrangement as defined in claim 1, wherein a portion of said component extends from said recess beyond one of said surfaces.

5. An arrangement as defined in claim 1, wherein said frame is deformable.

6. An arrangement as defined in claim 1, wherein said terminals include a third terminal and said conductors include a third conductor in contact with said third terminal, a portion of said third terminal overlapping a second portion of said second conductor and said frame having a portion interposed between said portion of said third terminal and said second portion of said second conductor.

* * * * *